US006204198B1

(12) United States Patent
Banerjee et al.

(10) Patent No.: US 6,204,198 B1
(45) Date of Patent: Mar. 20, 2001

(54) RAPID THERMAL ANNEALING OF DOPED POLYCRYSTALLINE SILICON STRUCTURES FORMED IN A SINGLE-WAFER CLUSTER TOOL

(75) Inventors: Aditi D. Banerjee, Plano; Douglas E. Mercer, Richardson; Rick L. Wise, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/447,174

(22) Filed: Nov. 22, 1999

Related U.S. Application Data

(60) Provisional application No. 60/109,628, filed on Nov. 24, 1998.

(51) Int. Cl.$^7$ .................. H01L 21/31; H01L 21/469; H01L 21/336

(52) U.S. Cl. .................. 438/766; 438/770; 438/787; 438/788; 438/279; 438/307; 438/308

(58) Field of Search .................. 438/758, 770, 438/787, 788, 301–308, 286–299, 275, 514–522, 766

(56) References Cited

U.S. PATENT DOCUMENTS

| | | | |
|---|---|---|---|
| 4,666,556 | * | 5/1987 | Fulton . |
| 4,851,358 | * | 7/1989 | Huber .................. 438/471 |
| 5,192,708 | * | 3/1993 | Beyer et al. .................. 438/361 |
| 5,264,396 | * | 11/1993 | Thakur et al. .................. 438/695 |
| 5,294,571 | * | 3/1994 | Fujishiro et al. .................. 438/770 |
| 5,869,378 | * | 2/1999 | Michael .................. 438/305 |
| 5,888,870 | * | 3/1999 | Gardner et al. .................. 438/261 |
| 6,022,784 | * | 2/2000 | Turner et al. .................. 438/303 |

(List continued on next page.)

OTHER PUBLICATIONS

Powell, R.A., Chow, R. Dopant Activation and Redistribution is As$^+$–Implanted Polycrystalline Si by Rapid Thermal Processing. Journal of Electrochemical Society: Solid–State Science and Technology. vol. 132, No. 1. Jan. 1985. pp. 194–198.

Tang, Thomas E. In–Situ Doped Polysilicon Using Vapor Dopant for High Density DRAMs. IEEE–IEDM. Jul. 1989. pp. 39–42. 2.5.1–2.5.4.

Katoh, H., Yoshida, T., Koike, A. Doped Polysilicon Technology and Applications. Semiconductor Design & Development Center. Hitachi, Ltd. Tokyo, Japan. pp. 342–345.

Miyata, H., et al. Low–Thermal–Budget Emitter Formation using In–Situ phosphorus doped TAS (Thermally deposited amorphous Silicon). Fujitsu Limited. pp. 240–241. ECS Spring 1992.

*Primary Examiner*—Wael Fahmy
*Assistant Examiner*—Brook Kebede
(74) *Attorney, Agent, or Firm*—Mark A. Valetti; Wade James Brady, III; Frederick J. Telecky, Jr.

(57) ABSTRACT

An embodiment of the instant invention is a method of fabricating an electronic device over a semiconductor substrate, the method comprising the steps of: forming a doped polycrystalline silicon layer insulatively disposed over the semiconductor substrate; and subjecting the doped polycrystalline silicon layer to a temperature of around 700 to 1100 C. in an oxidizing ambient for a period of around 5 to 120 seconds. Preferably, the oxidizing ambient is comprised of: $O_2, O_3$, NO, $N_2O$, $H_2O$, and any combination thereof. The temperature is, preferably, around 950 to 1050 C. (more preferably around 1000 C.). The step of subjecting the doped polycrystalline silicon layer to a temperature of around 700 to 1100 C. in an oxidizing ambient for a period of around 5 to 120 seconds, preferably, forms an oxide layer on the polycrystalline silicon layer, which has a thickness which is, preferably, greater than the thickness of a native oxide layer. More preferably, it has a thickness which is greater than 3 nm (more preferably greater than 2 nm). In an alternative embodiment, the thickness of the oxide layer is less than 20 nm (more preferably, less than 10 nm thick).

14 Claims, 3 Drawing Sheets

U.S. PATENT DOCUMENTS 6,063,679 * 5/2000 Gardner et al. ........................ 438/303
6,063,698 * 5/2000 Tseng et al. .......................... 438/585
6,071,783 * 6/2000 Liang et al. .......................... 438/301
6,080,629 * 6/2000 Gardner et al. ...................... 438/301

* cited by examiner

RAPID THERMAL ANNEALING OF DOPED POLYCRYSTALLINE SILICON STRUCTURES FORMED IN A SINGLE-WAFER CLUSTER TOOL

This application claims priority under 35 USC §119(e)(1) of provisional application Ser. No. 60/109,628 filed Nov. 24, 1998.

FIELD OF THE INVENTION

The instant invention pertains to semiconductor device fabrication and processing and more specifically to a method of fabricating a doped polycrystalline silicon structure.

BACKGROUND OF THE INVENTION

An ever present trend in semiconductor device manufacturing involves the reduction in size of devices while trying to reduce the power consumed by devices. In more practical terms, this means shrinking each of the structures of the devices while trying to reduce the resistivity of structures that are subjected to any appreciable amount of electrical potential. One structure that is affected by these trends is the gate structure. With the shrinking of the device, the width of the gate structure is reduced. However, this reduction in width results in higher resistance of the gate structure because resistance of a structure is inversely proportional to the cross-sectional area of the structure. In order to reduce the resistance of these shrinking gate structures, the resistivity of the material which is used to form the gate structure, typically polycrystalline silicon (poly or polysilicon), needs to be reduced, because resistance of a structure is proportional to the resistivity of the material used to form the structure.

In an attempt to reduce the resistivity of gate structures which are made of polysilicon, many device manufacturers dope the polysilicon with either n-type dopants (for NMOS transistors) or p-type dopants (for PMOS transistors). The polysilicon can be in-situ doped as it is deposited or doped by implanting dopants after the polysilicon layer is formed over the semiconductor wafer. However, there are problems with doped polysilicon structures. One problem involves the migration of dopants during subsequent thermal processing (a higher temperature step is required after the dopants are put into the polysilicon so as to diffuse the dopants throughout the polysilicon film and render them electrically active). More specifically, dopants may escape from the doped polysilicon structure during these thermal processing steps. Hence, the full advantage in doping these films, i.e. the reduction of the resistivity of these films, is not fully achieved.

Two possible solutions to this problem involve either increasing the dopant concentration or using a furnace anneal. Placing more dopants into the polysilicon creates other problems, though, and may not solve the original problem because it may not be possible to place enough dopants into the polysilicon to replace those leaving. One of the problems with putting more dopants into the polysilicon is that the dopants may migrate from the polysilicon, through the underlying gate insulating material and into the substrate thereby degrading the transistor. Another problem is that unwanted change to the polysilicon grain structure may occur during the implantation of these large amount of dopants.

A furnace annealing process occurs for a long duration at an elevated temperature. While the annealing may take place in nitrogen ambient, an oxide layer forms on the surface of the wafers during loading in the furnace. The formation of an oxide layer on the polysilicon holds in the dopants. This type of process is contrary to another trend in the semiconductor device fabrication industry which involves the reduction of the "thermal budget" of the process to fabricate these devices. The "thermal budget" of a process is related to the various increased temperatures that the devices are subjected to in order to fabricate the devices and the time in which the devices are subjected to these elevated temperatures. Hence, the "thermal budget" can be reduced by either reducing the temperature of these elevated temperature steps or by limiting the duration of the elevated temperature steps. Since many fabrication steps require elevated temperatures, it may not be possible to significantly reduce the temperature of these steps. In response to this, many semiconductor device manufacturers are trying to use very high temperatures for very short periods in time. This type of processing is generically referred to as "rapid thermal processing" (RTP). More specifically, the RTP designation generally refers to: rapid thermal anneal (RTA), rapid thermal nitridation (RTN), and other rapid thermal steps. Typical RTA processing is accomplished in a vacuum or inert ambient and may reach temperatures as high as 1200C. Hence, this type of annealing will exacerbate the migration of dopants from the polysilicon layer.

In an attempt to rectify this problem, some manufacturers of semiconductor devices form a capping layer, consisting of silicon dioxide, on the polysilicon layer prior to the rapid thermal annealing of the polysilicon. However, this adds the additional processing steps of forming this thick layer (typically the layer is around 60 nm thick) and removing this layer. Examples of this process can be found in the following publications: R. A. Powell & R. Chow, *Dopant Activation and Redistribution in $As^+$-Implanted Polycrystalline Si by Rapid Thermal Processing*, JOURNAL OF ELECTROCHEMICAL SOCIETY: SOLID-STATE SCIENCE AND TECHNOLOGY 194–198 January 1985); and S. R. Wilson et. al., *Fast Diffusion of As in Polycrystalline Silicon During Rapid Thermal Annealing*, 45(4) APPLIED PHYSICS LETTERS 464–466 (Aug. 15, 1984).

SUMMARY OF THE INVENTION

An embodiment of the instant invention is a method of fabricating an electronic device over a semiconductor substrate, the method comprising the steps of: forming a doped polycrystalline silicon layer insulatively disposed over the semiconductor substrate; and subjecting the doped polycrystalline silicon layer to a temperature of around 700 to 1100 C. in an oxidizing ambient for a period of around 5 to 120 seconds. Preferably, the oxidizing ambient is comprised of: $O_2$, $O_3$, NO, $N_2O$, $H_2O$, and any combination thereof. The temperature is, preferably, around 950 to 1050 C. (more preferably around 1000 C.). The step of subjecting the doped polycrystalline silicon layer to a temperature of around 700 to 1100 C. in an oxidizing ambient for a period of around 5 to 120 seconds, preferably, forms an oxide layer on the polycrystalline silicon layer, which has a thickness which is, preferably, greater than the thickness of a native oxide layer. More preferably, it has a thickness which is greater than 3 nm (more preferably greater than 2 nm). In an alternative embodiment, the thickness of the oxide layer is less than 20 nm (more preferably, less than 10 nm thick).

Another embodiment of the instant invention, is a method of fabricating a transistor having a conductive gate structure insulatively disposed over a semiconductor substrate, the method comprising the steps of: forming a gate insulating layer on the semiconductor substrate; forming a polycrystalline silicon layer on the gate insulating layer, the polycrystalline silicon layer is doped with a dopant; subjecting the transistor to a temperature of around 700 to 1100 C.in an oxidizing ambient for a period of around 5 to 120 seconds; and wherein the oxidizing ambient is comprised of: $O_2$, $O_3$, NO, $N_2O$, $H_2O$, and any combination thereof.

BRIEF DESCRIPTION OF THE DRAWINGS

FIG. 3a illustrates the measured dopant levels in a polysilicon layer after the layer was in-situ doped/deposited. FIG. 3b illustrates a polysilicon layer doped as is shown in FIG. 3a after a prior art RTA process. FIG. 3c illustrates a polysilicon layer doped as is shown in FIG. 3a after the RTA method of the instant invention.

Figure 1:
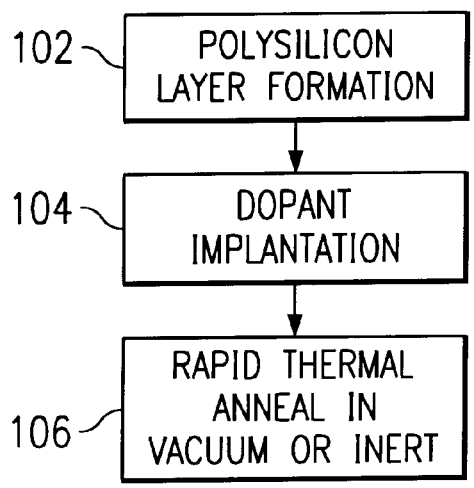
FIG. 1 is a flow diagram of a prior art process flow for forming a doped polysilicon layer.

Common reference numerals are used throughout the following Detailed Description to designate like or equivalent features.

DETAILED DESCRIPTION OF THE DRAWINGS

While the following description will be centered around the formation of a polysilicon gate structure, the anneal process can be utilized at any level of processing and it can be used to form any type of doped silicon-containing structure. In addition, the anneal step of the instant invention can be used with respect to any type of silicon-containing material (such as single-crystal silicon, polysilicon, or epitaxial silicon) and any type of dopants (such as phosphorous, arsenic, and/or boron). The anneal of the instant invention can be utilized to form devices used in memory devices, logic devices, processors, high-power device, low-power devices, analog devices or any combination thereof.

Figure 3A:
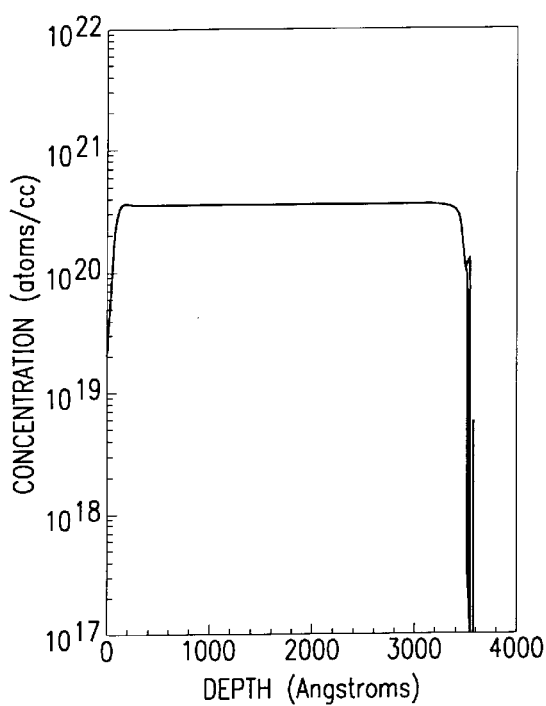
FIGS. 3a–3c are graphs illustrating measured dopant levels in a polysilicon layer.

Prior to the deposition of the polysilicon layer in step 102, a gate dielectric material is formed on the substrate. The gate dielectric material is preferably on the order of 2 to 15 nm thick and is, preferably, comprised of an oxide, a nitride, a higher dielectric constant material (such as BST, PZT, tantalum pentoxide), or a combination of any of the above. Preferably, the substrate is comprised of single-crystal silicon (which may or may not be doped) or doped or undoped epitaxial silicon formed on single-crystal silicon or silicon on insulator (SOI). In step 102, a polysilicon layer is formed on the gate insulating material. This can be accomplished using any processing technique. The polysilicon layer is preferably on the order of 150 to 400 nm thick (more preferably around 250 to 350 nm thick). Next, in step 104, one or more dopants are implanted into the polysilicon layer. The dopant level is preferably on the order of around $1 \times 10^{20}$ to $1 \times 10^{21}$ atoms/cm$^3$ (more preferably around $4 \times 10^{20}$ atoms/cm$^3$). This is illustrated in FIG. 3a, where a depth of zero is the upper-most surface of the polysilicon layer and a depth of around 350 nm is the bottom-most surface of the polysilicon layer. If more than one dopant is implanted, this may be done in two steps. In fact, the second dopant can be implanted after anneal step 206.

Figure 3B:
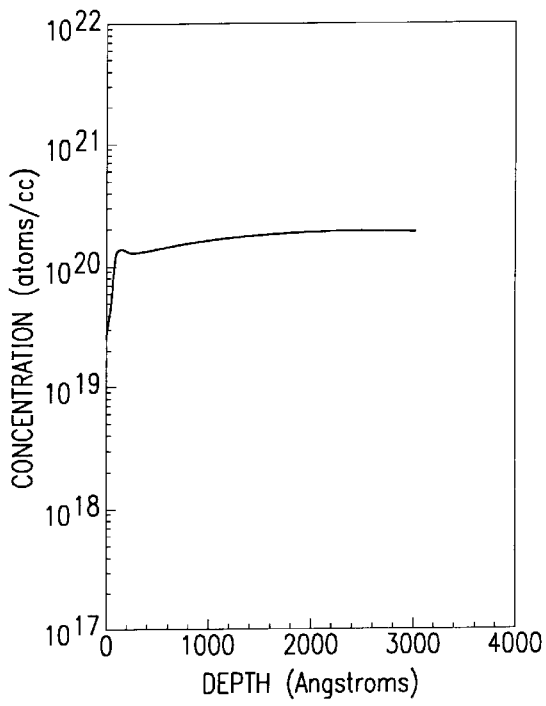

In the prior art method of FIG. 1, step 104 is followed by an RTA step 106 which consists of subjecting the wafer to a high-temperature for a short period of time in either a vacuum or an inert ambient (such as nitrogen). However, as can be seen in FIG. 3b, the dopant concentration in the polysilicon layer has gone from around $4 \times 10^{20}$ to around $1.75 \times 10^{20}$ atoms/cm$^3$.

Figure 2A:
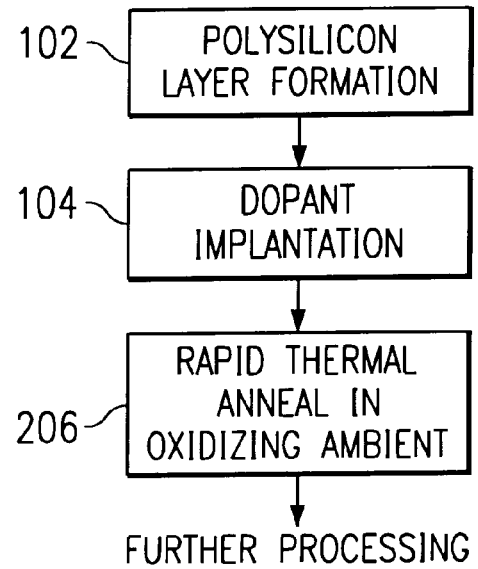
FIGS. 2a and 2b are flow diagrams illustrating the process flows of the instant invention.
Figure 4:
FIG. 4 is a cross-sectional photo of a partially fabricated device which was fabricated using the method of the instant invention.

In the method of the instant invention as is illustrated in FIG. 2a, step 104 is followed by RTA step 206. Preferably, RTA step 206 is accomplished by subjecting the wafer to a temperature of around 700 to 1100 C.(more preferably around 950 to 1050 C.—even more preferably around 1000 C.) for around 5 to 120 seconds (more preferably around 20 to 60 seconds—even more preferably around 30 to 45 seconds) in an oxidizing ambient (preferably $O_2$, $O_3$, NO, $N_2O$, $H_2O$, or any combination thereof). This will result in the formation of an oxide layer on the polysilicon layer which will inhibit the dopants from leaving the polysilicon layer. Preferably, the oxide layer will be around 2.5 to 10 nm thick. This is illustrated in FIG. 4 as oxide region 404 which is situated on polysilicon layer 402. A native oxide, which is around 1 nm thick, is not sufficient to inhibit the migration of the dopants out of the polysilicon layer.

Figure 3C:
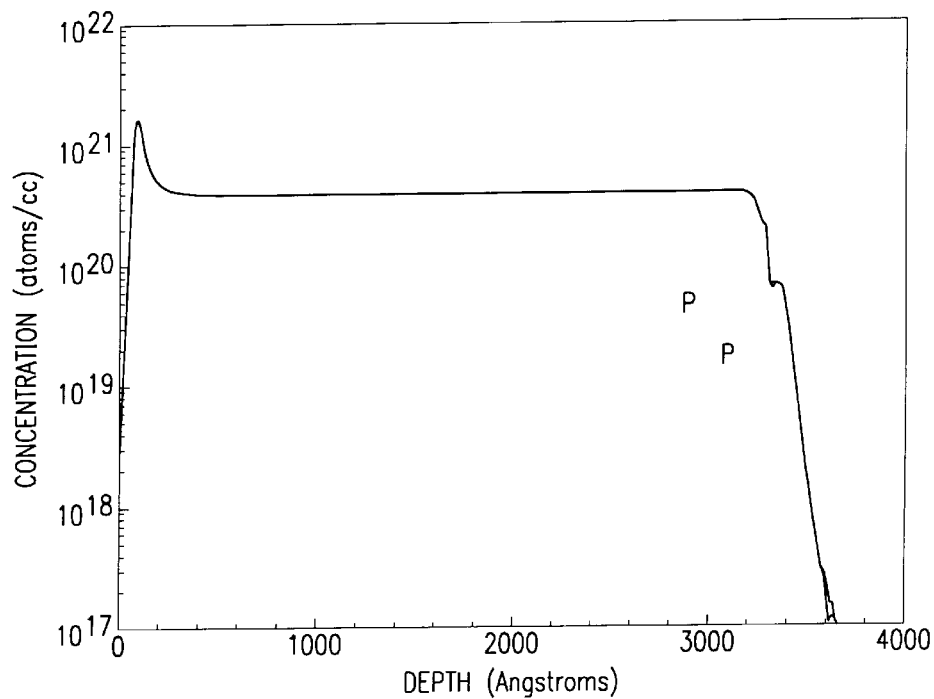

FIG. 3c illustrates that the dopant level of the polysilicon layer after the anneal step of the instant invention does not appreciable change from that of the original doping level. The as-doped doping level of FIG. 3a is around $4 \times 10^{20}$ atoms/cm$^3$ and the doping level after the anneal step of the instant invention, as measured and shown in FIG. 3c, is also around $4 \times 10^{20}$ atoms/cm$^3$.

Figure 2B:
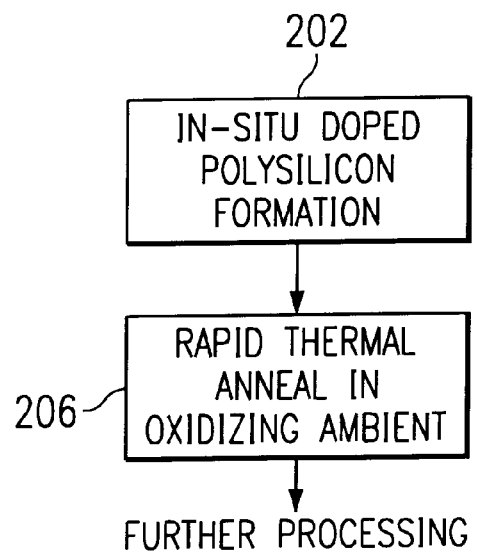

In the alternative embodiment of FIG. 2b, the polysilicon layer is in-situ doped as it is deposited (step 202). Step 202 can be accomplished using standard processing techniques. The dopant level of the polysilicon layer using step 202 is preferably the same as is doped using step 104. The anneal step of the instant invention (step 206) is, preferably, accomplished by subjecting the wafer to a temperature of around 700 to 1100 C.(more preferably around 950 to 1050 C.—even more preferably around 1000 C.) for around 5 to 120 seconds (more preferably around 20 to 60 seconds— even more preferably around 30 to 45 seconds) in an oxidizing ambient (preferably $O_2$, $O_3$, NO, $N_2O$, $H_2O$, or any combination thereof). This will result in the formation of an oxide layer on the polysilicon layer which will inhibit the dopants from leaving the polysilicon layer. Preferably, the oxide layer will be around 2.5 to 10 nm thick. As was discussed with reference to the other embodiment of the instant invention, the level of dopants in the polysilicon film after step 206 should be roughly the same as were formed in step 202. Referring to FIG. 4, structure 402 is the silicon substrate and layer 404 is the thermally grown silicon dioxide layer. Layer 406 is a polycrystalline silicon layer, and layer 408 is an oxide layer formed using the method of the instant invention.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating an electronic device over a semiconductor substrate, said method comprising the steps of:

forming a doped polycrystalline silicon layer doped to a level of from about $1.75 \times 10^{20}$ to about $4 \times 10^{20}$ atoms per cm$^3$ over a semiconductor substrate; and forming an oxide layer on said layer of doped polycrystalline silicon by subjecting said doped polycrystalline silicon layer to a temperature of from substantially 700° to substantially 1100° C. in an oxidizing ambient for a period of from substantially 5 to substantially 120 seconds to substantially maintain the doping level in said polycrystalline silicon layer.

2. The method of claim 1, wherein said oxidizing ambient is comprised of a substance selected from the group consisting of: $O_2$, $O_3$, NO, $N_2O$, $H_2O$ and any combination thereof.

3. The method of claim 1, wherein said temperature is from substantially 950° to substantially 1050° C.

4. The method of claim 3, wherein said temperature is substantially 1000° C.

5. The method of claim 1 wherein said thickness of said oxide layer is from about 2 nm to about 20 nm.

6. A method of fabricating a transistor having a conductive gate structure insulatively disposed over a semiconductor substrate, said method comprising the steps of:

(a) forming a gate insulating layer on a semiconductor substrate;

(b) forming a polycrystalline silicon layer on said gate insulating layer, said polycrystalline silicon layer being doped to a level of from about $1.75 \times 10^{20}$ to about $4 \times 10^{20}$ atoms per cm$^3$;

(c) forming an oxide layer on said layer of doped polycrystalline silicon by subjecting the structure of step (b) to a temperature of from substantially 700° to substantially 1100° C. in an oxidizing ambient for a period of from substantially 5 to substantially 120 seconds, said oxidizing ambient being comprised of a substance selected from the group consisting of: $O_2$, $O_3$, NO, $N_2O$, $H_2O$, and any combination thereof.

7. The method of claim 2 wherein said thickness of said oxide layer is from about 2 nm to about 20 nm.

8. The method of claim 3 wherein said thickness of said oxide layer is from about 2 nm to about 20 nm.

9. The method of claim 4 wherein said thickness of said oxide layer is from about 2 nm to about 20 nm.

10. The method of claim 1 wherein said temperature is about 1000° C. for a period of about 30 to 45 seconds and said oxide layer is from about 2.5 to about 10 nm in thickness.

11. The method of claim 2 wherein said temperature is about 1000° C. for a period of about 30 to 45 seconds and said oxide layer is from about 2.5 to about 10 nm in thickness.

12. The method of claim 6 wherein said thickness of said oxide layer is from about 2 nm to about 20 nm.

13. The method of claim 6 wherein said temperature is about 1000° C. for a period of about 30 to 45 seconds and said oxide layer is from about 2.5 to about 10 nm in thickness.

14. The method of claim 13 wherein said temperature is about 1000° C. for a period of about 30 to 45 seconds and said oxide layer is from about 2.5 to about 10 nm in thickness.

* * * * *